(12) United States Patent
Fischer et al.

(10) Patent No.: US 7,315,998 B2
(45) Date of Patent: Jan. 1, 2008

(54) INTEGRATED CIRCUIT ARRANGEMENT WITH INTERMEDIATE MATERIALS AND ASSOCIATED COMPONENTS

(75) Inventors: Armin Fischer, München (DE); Alexander Von Glasow, Grünwald (DE)

(73) Assignee: Infineon Technologies AG, Munich (DE)

( * ) Notice: Subject to any disclaimer, the term of this patent is extended or adjusted under 35 U.S.C. 154(b) by 232 days.

(21) Appl. No.: 10/526,881

(22) PCT Filed: Aug. 14, 2003

(86) PCT No.: PCT/DE03/02741

§ 371 (c)(1), (2), (4) Date: Mar. 3, 2005

(87) PCT Pub. No.: WO2004/025729

PCT Pub. Date: Mar. 25, 2004

(65) Prior Publication Data

US 2005/0275103 A1 Dec. 15, 2005

(30) Foreign Application Priority Data

Sep. 5, 2002 (DE) ............... 102 41 154

(51) Int. Cl.
G06F 17/50 (2006.01)
(52) U.S. Cl. ............... 716/13; 716/11; 716/14
(58) Field of Classification Search ............ 716/1, 716/11–14
See application file for complete search history.

(56) References Cited

U.S. PATENT DOCUMENTS

| 5,661,345 | A | 8/1997 | Wada et al. |
| 5,798,299 | A | 8/1998 | Chung |
| 6,225,211 | B1 | 5/2001 | Tsui |
| 6,313,536 | B1 | 11/2001 | Yamada |
| 2002/0030278 | A1* | 3/2002 | Weber ............ 257/758 |
| 2002/0033539 | A1 | 3/2002 | Wada et al. |
| 2002/0046874 | A1* | 4/2002 | Cabral et al. ...... 174/137 R |
| 2002/0061644 | A1 | 5/2002 | Lopatin et al. |

FOREIGN PATENT DOCUMENTS

| EP | 1 077 486 A1 | 2/2001 |
| GB | 2 366 912 A | 3/2002 |

* cited by examiner

*Primary Examiner*—Thuan Do
(74) *Attorney, Agent, or Firm*—Brinks Hofer Gilson & Lione

(57) ABSTRACT

An integrated circuit arrangement having a metallization layer, an interconnect dielectric, electrically conductive interconnect intermediate material, electrically conductive connecting sections, connecting section dielectric between the connecting sections, and connecting section intermediate material. The metallization layer contains electrically conductive interconnects between which the interconnect dielectric is disposed. The electrically conductive interconnect intermediate material is arranged between a side area of an interconnect and the interconnect dielectric. The electrically conductive connecting sections in each case form a section of an electrically conductive connection to or from an interconnect and the connecting section dielectric is between the connecting sections. The connecting section intermediate material is arranged in each case between a connecting section and the connecting section dielectric and/or between a connecting section and an interconnect. The interconnect intermediate material and the connecting section intermediate material make contact with one another at at least one connection.

11 Claims, 7 Drawing Sheets

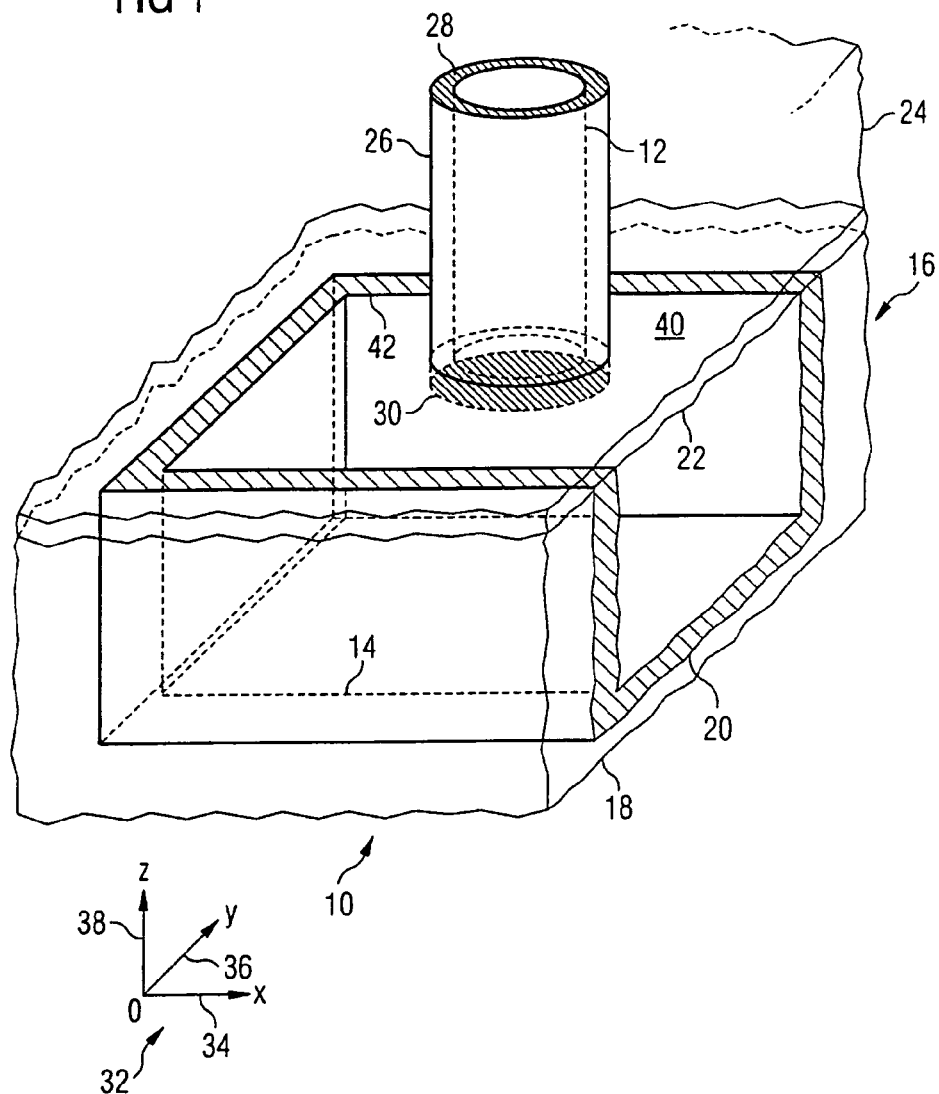

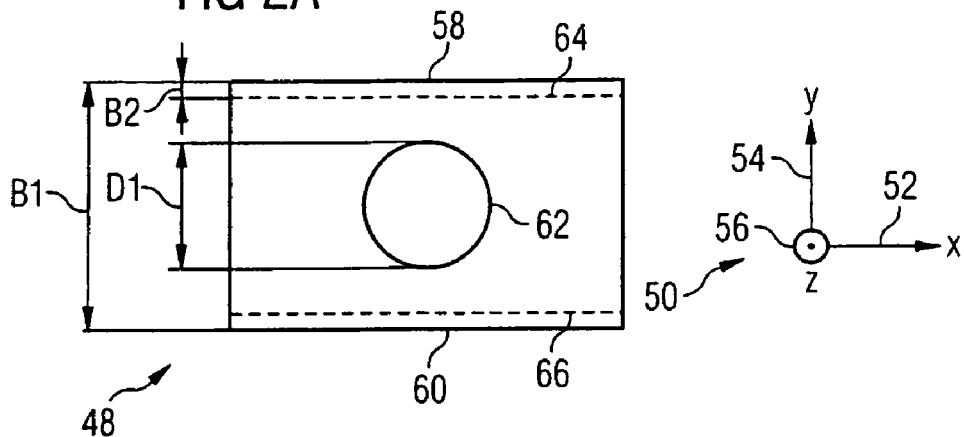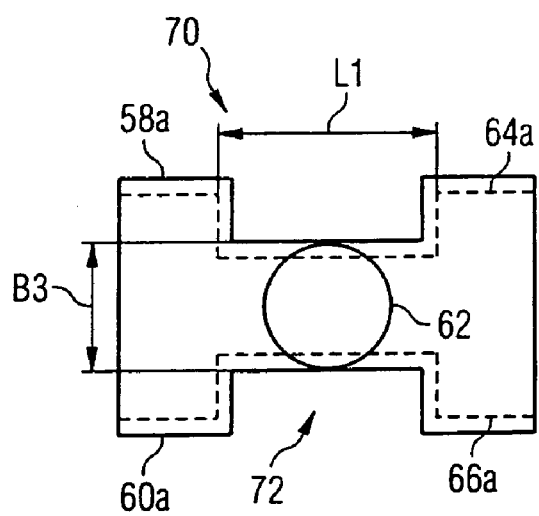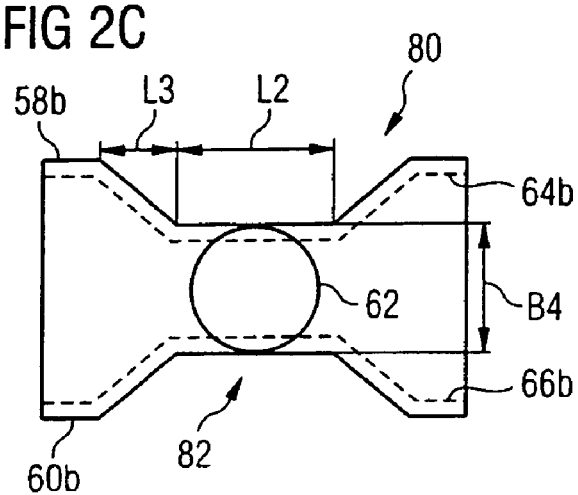

Figure 3A:
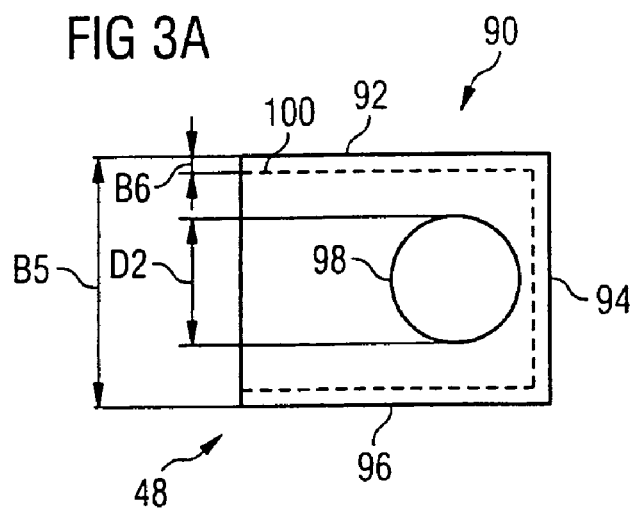

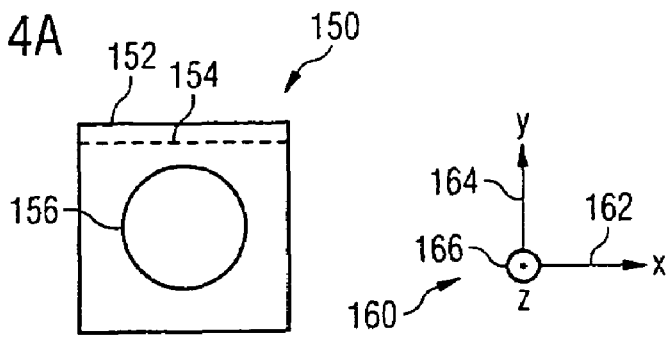
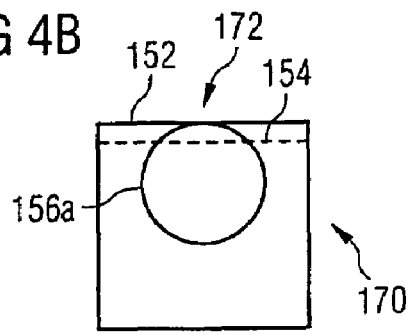
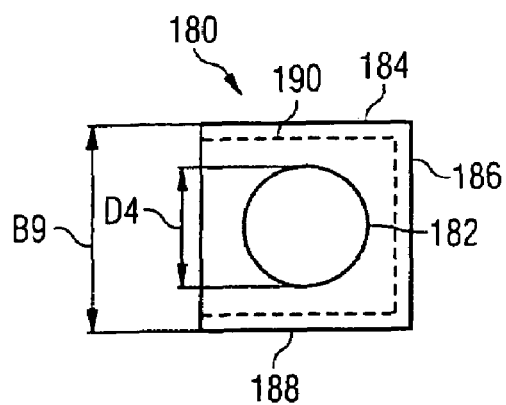
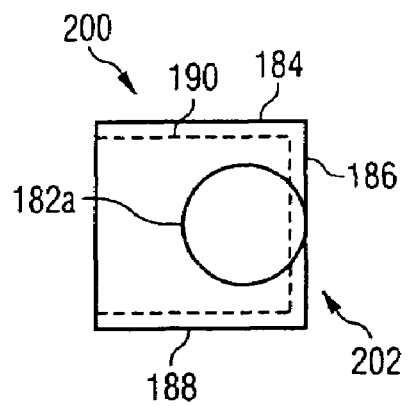
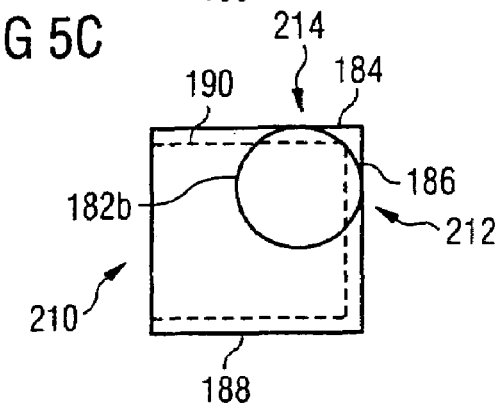

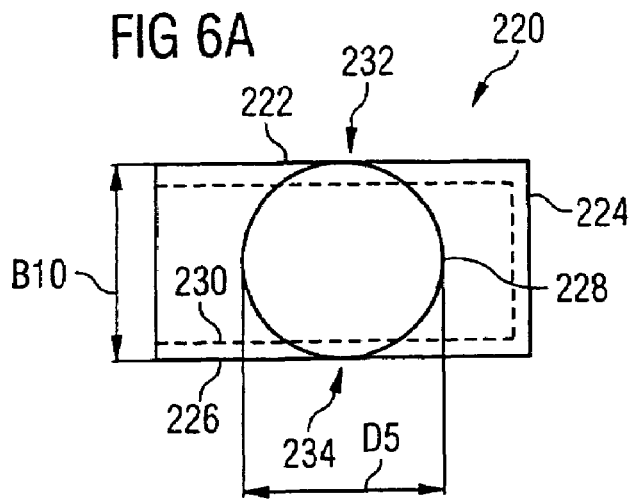
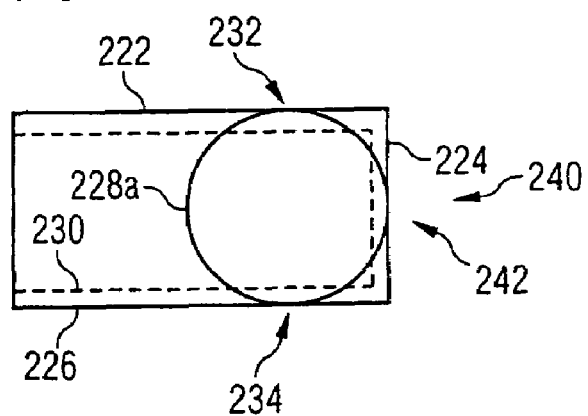
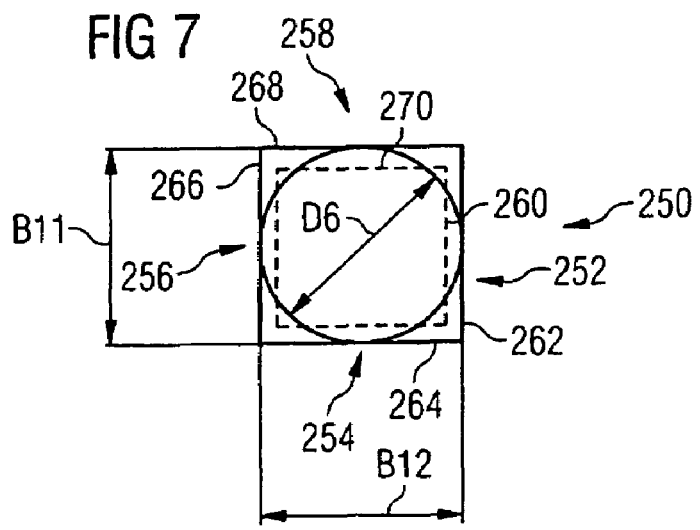

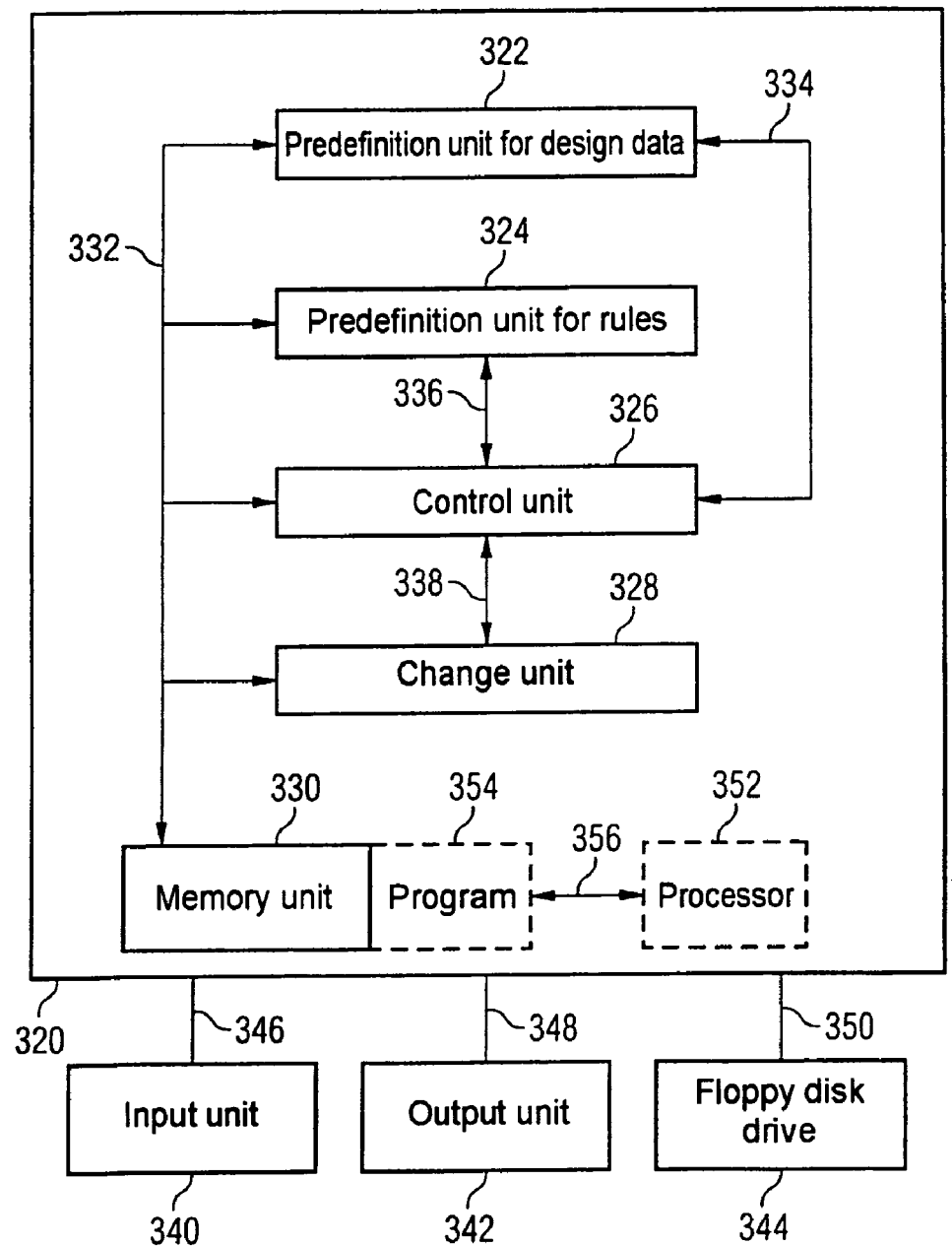

INTEGRATED CIRCUIT ARRANGEMENT WITH INTERMEDIATE MATERIALS AND ASSOCIATED COMPONENTS

This application is the national stage application of international application number PCT/DE03/02741, filed on Aug. 14, 2003, which claims the benefit of priority to German Patent Application 102 41 154.9, filed on Sep. 5, 2002, incorporated herein by reference.

The invention relates to an integrated circuit arrangement containing at least one metallization layer. A multiplicity of electrically conductive interconnects, for example made of copper or made of aluminum, are arranged in the metallization layer. Arranged between the interconnects of the metallization layer is an interconnect dielectric, for example silicon dioxide or a material having a dielectric constant of significantly less than four. An electrically conductive interconnect intermediate material, which differs from the material of the interconnect, is in each case arranged between a side area of an interconnect that is situated transversely with respect to the metallization layer in the metallization layer and the interconnect dielectric.

The integrated circuit arrangement additionally contains a multiplicity of electrically conductive connecting sections, for example so-called vias, which in each case form a section—adjacent to the interconnect—of an electrically conductive connection to or from an interconnect. By way of example, the connecting sections comprise tungsten or copper. Arranged between the connecting sections is a connecting section dielectric having for example the same material composition as the interconnect dielectric. A connecting section intermediate material is arranged between a connecting section and the connecting section dielectric and/or between a connecting section and an interconnect.

The intermediate materials are also referred to as liners, inter alia, and fulfill for example at least one of the following functions:

formation of a metallurgical barrier layer,
formation of a diffusion barrier,
increasing the adhesive force of the interconnect or of the connecting section in the dielectric,
compensation of material stresses.

Suitable materials for the intermediate material are for example the refractory metals molybdenum, tungsten, tantalum and titanium. In particular, however, the nitrides of said metals are also used as intermediate material, if appropriate also in double layers or multilayers, e.g. titanium/titanium nitride.

It is an object of the invention to specify an integrated circuit arrangement which is constructed in a simple manner and has improved electrical properties in comparison with known circuit arrangements, in particular an increased reliability and/or service life. Moreover, the intention is to specify an associated method for generating design data for the production of this circuit arrangement, an associated program and an associated data processing system.

The invention is based on the consideration that the resistance of the connecting section/interconnect system to electromigration but also to stress migration and thermocycling robustness depend to a very great extent on the arrangement of the intermediate materials with respect to one another. By way of example, if the connecting section intermediate material is arranged at a distance from the interconnect intermediate material, then there is no redundancy through the intermediate material in the conduction of the current. In the case of a hole formation (void) in the region of the contact of connecting section and interconnect as a result of electromigration or else stress migration, the intermediate material is not available as a redundant current path. Consequently, even small vacancy volumes lead to a large resistance increase in the contact resistance between interconnect and connecting section and can considerably impair the function of the integrated circuit. The circuit arrangement can even fail.

Therefore, in the case of the circuit arrangement according to the invention, at at least one connection, the interconnect intermediate material makes contact with the connecting section intermediate material for example at an edge of the interconnect. The contact between the intermediate materials produces a current path redundancy which enables longer operation of the integrated circuit arrangement even with electromigration remaining the same.

In one development of the circuit arrangement, at the connection, the interconnect intermediate material and the connecting section intermediate material make contact at two or three or four side areas or edges of an interconnect. At interconnects at which the connecting section or the via is connected to the interconnect intermediate material at two, three or four side areas or edges, the current conductivity is significantly higher than in comparison with arrangements without a contact location or with only one contact location or a small contact region of connecting section intermediate material and interconnect material. A cause of this is the "barrier redundancy". Even with insipient formation of vacancies below or above the connecting section as a result of electromigration or stress migration, the current still flows via the electrically conductive intermediate material. An appreciable increase in resistance resulting in a functional disturbance or the failure of the circuit arrangement occurs only in the case of a comparatively large vacancy volume, i.e. in the case of a correspondingly higher current loading or a longer operating duration in comparison with structures without or with reduced intermediate material redundancy.

The contact of two side areas or edges can be achieved if the connecting arrangement is arranged in a corner of a covering area or an otherwise liner-free bottom area of the interconnect or if the interconnect and the connecting section have approximately the same extent in the lateral direction. The contact of three side areas or edges is made possible if the connecting section and the interconnect have the same extent in the lateral direction and if the connecting section is arranged at the end of the interconnect. A contact of four side areas or edges is possible when the connecting section and the interconnect in each case have the same dimensions in two directions that are at right angles to one another. Such dimensions are expedient for example in the case of connecting sections that are stacked one above the other and penetrate through a plurality of metallization layers. In each metallization layer there are so-called connection plates with a square or rectangular basic area for connecting the connecting sections.

In a next development, the interconnect has a constriction at the connecting section, the width of said constriction being chosen in one refinement such that contact regions are produced at opposite side areas of the interconnect. The constriction can be dimensioned to be comparatively short in comparison with the total length of an interconnect. Thus, in one refinement, the constriction, along the longitudinal axis of the interconnect, has a length that is less than five times or even less than three times the width of the constriction at its narrowest location. The use of constrictions is a simple possibility for increasing the number of contact regions of the intermediate materials.

In one development of the circuit arrangement with constriction, the connecting section is arranged at the end of the interconnect. The constriction has the form of a wedge or the form of a step.

In an alternative development of the circuit arrangement with constriction, the interconnect extends in at least two different directions from the connecting section. The constriction has, at its ends, in each case the form of a wedge or the form of a step. In the case of constrictions within an interconnect, particular consideration is to be given to secondary effects, such as e.g. current concentration. In order to avoid local current spikes in the case of the current concentration that is unavoidable due to the constriction, the interconnect is not constricted abruptly at angles of ninety degrees, for example, but rather gradually.

In a next development, at least two sections of the same interconnect or of different interconnects are wider than the connecting sections at connecting sections. The contact regions of the intermediate materials are situated at such side areas of the interconnect sections whose normal directions are situated transversely or oppositely with respect to one another. This requires arrangement of the connecting sections in a targeted manner at side areas with a normal direction that differs from one another.

In a further aspect, the invention relates to a method for generating design data for the production of integrated circuit arrangements, in particular of the circuit arrangement according to the invention or one of its developments. In the case of the method according to the invention, design data and rules for altering the design data are predefined. An automatic application of the rules to the design data has the consequence that the number of contact locations of interconnect intermediate material and connecting section intermediate material is increased in a targeted manner. The automatic application of the rules makes it possible to test, and if appropriate alter, the design at a multiplicity of connecting sections in a very short time. If appropriate, only sampling inspection by experienced development personnel is necessary.

In one development of the method, the rules comprise two fundamental variants for increasing the number of contact locations, namely:
 local constriction of interconnects, and
 displacement of interconnects or connecting sections, in one refinement a displacement of interconnects also including a shortening of the interconnect.

The invention additionally relates to a program and an apparatus, in particular a data processing system, which are suitable for carrying out the method according to the invention or one of its developments. The abovementioned technical effects thus hold true for the method, for the program and for the apparatus.

Figure 3B:
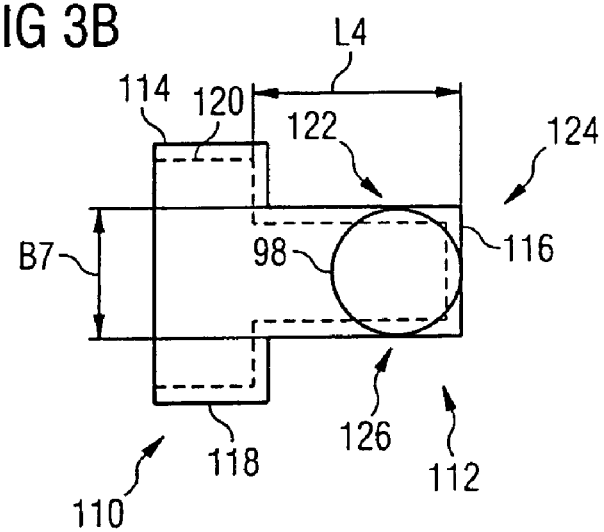
Figure 3C:
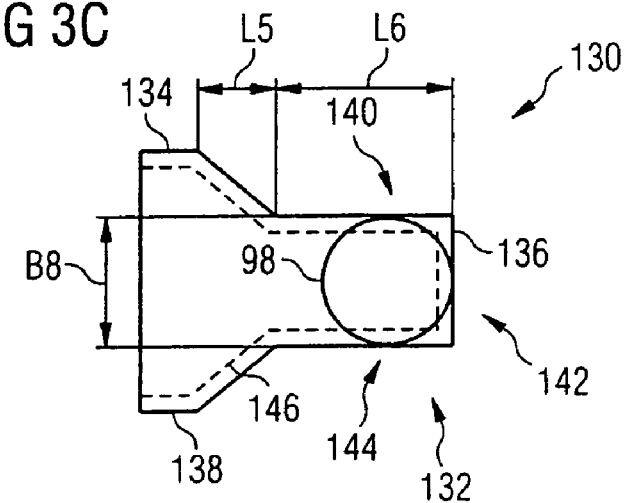
Figure 8:
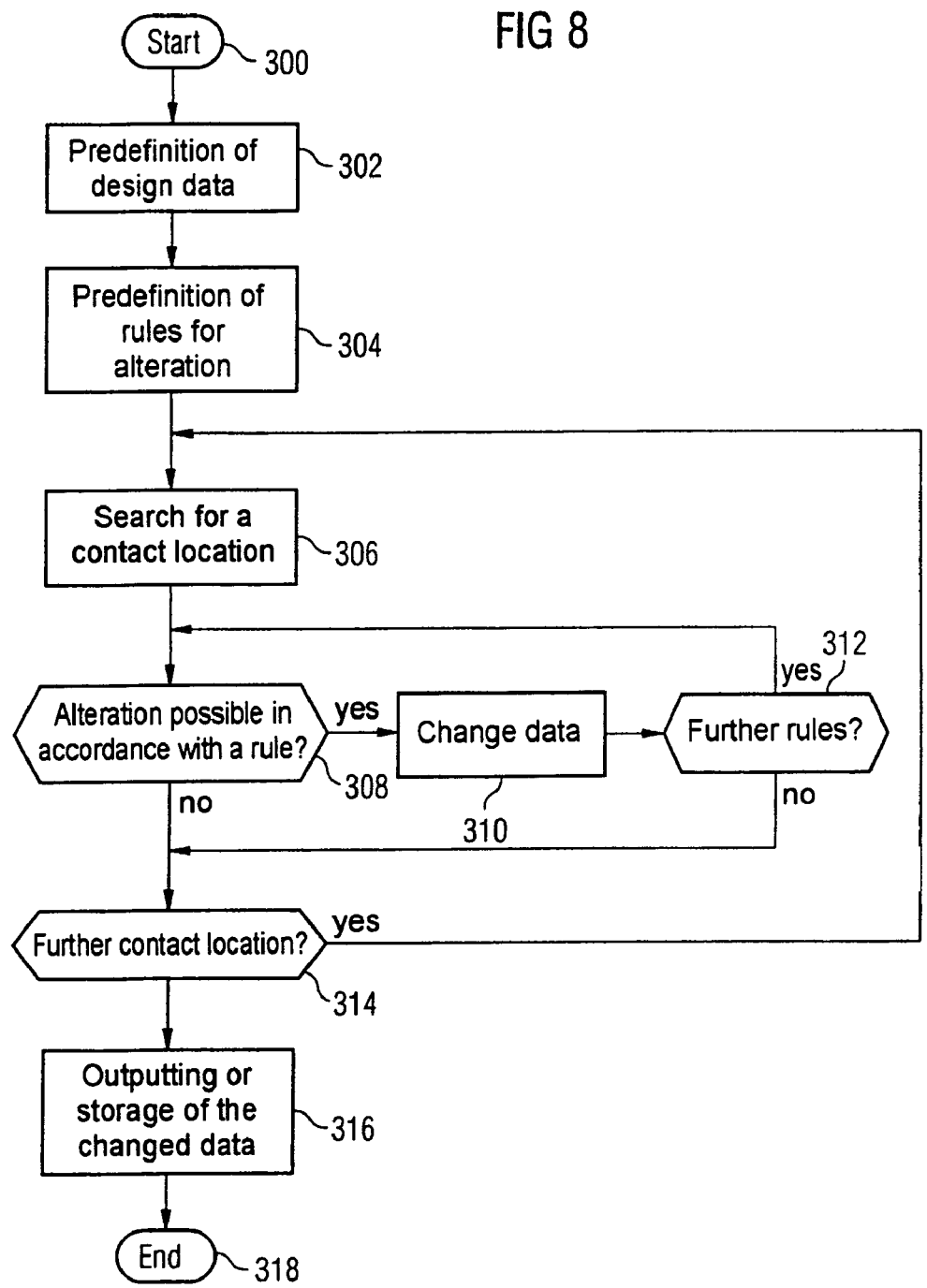

Exemplary embodiments of the invention are explained below with reference to the drawings, in which:

FIG. 1 shows a via and an interconnect without a contact location between the liner of the interconnect and the liner of the via, FIGS. 2A to 2C show the production of local constrictions within an interconnect in a design, FIGS. 3A to 3C show the production of local constrictions at the end of an interconnect in a design, FIGS. 4A and 4B show the displacement of a via to the edge of an interconnect in a design, FIGS. 5A to 5C show the displacement of a via to an end edge of an interconnect or into a corner of an interconnect covering area in a design, FIGS. 6A and 6B show the displacement of a via having the same width as an interconnect to the end of the interconnect in a design, FIG. 7 shows a design for an arrangement with quadruple liner contact, FIG. 8 shows method steps for increasing the contact locations of liners in a targeted manner, and FIG. 9 shows an apparatus for performing the method.

FIG. 1 shows a detail from an integrated circuit arrangement 10 containing a via 12 and an interconnect 14. Associated with the integrated circuit arrangement 10 are design data which have not yet been processed with the aid of a method for increasing the number of contact locations of liners in a targeted manner.

The integrated circuit arrangement 10 contains a metallization layer 16 extending essentially in a plane that lies parallel to the surface of a semiconductor substrate (not illustrated) in which a multiplicity of integrated semiconductor components are arranged, e.g. FET transistors (field effect transistor). The metallization layer 16 contains, besides the interconnect 14, a multiplicity of other interconnects (not illustrated) that are isolated from one another by a dielectric 18, for example by silicon dioxide. In the exemplary embodiment, the interconnects 14 of the metallization layer 16 comprise copper.

The metallization layer 14 has been produced with the aid of a so-called damascene or dual damascene method. In this method, the following steps are performed in the order specified:
 the dielectric 18 is deposited,
 trenches for the interconnects 14 are etched,
 an interconnect liner layer is deposited, which gives rise for example to an interconnect liner 20 for the interconnect 14 at the bottom and at the side areas of the trenches for the interconnect 14 that are situated transversely in the metallization layer 16 and thus later also at the bottom and the side areas of the interconnect 14 that are situated transversely with respect to the metallization layer 16. The interconnect liner layer has for example a thickness of 5 nm, of 15 nm or of 20 nm,
 the trenches for the interconnects 14 are filled with the interconnect material, and
 by means of a chemical mechanical polishing method, the filling material and the liner material are removed again above the trench edges, planarization being effected.

The metallization layer 16 is covered by a dielectric intermediate layer 22, for example made of silicon nitride. Situated above the dielectric intermediate layer 22 is a dielectric layer 24 e.g. made of silicon dioxide, in which a multiplicity of vias are arranged, for example the via 12.

During the production of the via 12 and the other vies, firstly contact holes 26 were etched into the dielectric layer 24 and the dielectric intermediate layer 22. This means that there is no interconnect liner 20 at a covering area remote form the bottom area of the interconnect 14. A via liner layer was subsequently deposited, for example a via liner 28 having been deposited in the contact hole 26. The via liner 28 also covers the bottom 30 of the contact hole 26. The bottom 30 o the contact hole 26 bears directly on a covering area of the interconnect 14 or penetrates the interconnect 14 somewhat. By way of example, the via line 28 has the same thickness as the interconnect liner 20. In the exemplary embodiment, the liner material for the interconnect liner 20 and for the via liner 28 is titanium nitride. The area of the interconnect 14 that is adjacent to a connecting section 12 is essentially free and/or more than 80% free of an electrically conductive intermediate material.

After the deposition of the via liner 28, the contact holes 26 were filled with tungsten or copper, for example, the via 12 having been produced. Still further metallization layers are situated above the dielectric layer 24 in the exemplary embodiment.

FIG. 1 additionally illustrates a system 32 of coordinates having an x axis 34, a y axis 36 and a z axis 38. The x-y plane lies parallel to the planes in which lie the metallization layer 16, the dielectric intermediate layer 22 and the dielectric layer 24. The z direction corresponds to the direction in which the metallization layer 16, the dielectric intermediate layer 22 and the dielectric layer 24 are stacked one above the other. The z direction thus corresponds to the direction of a normal to the surface of the semiconductor substrate.

As can readily be discerned in FIG. 1 on account of hatching of edge areas of the interconnect liner 20 and of the via liner 28, interconnect liner 20 and via liner 28 do not make contact. It is possible, however, to produce such contact locations in the case of a covering area of the interconnect 14 that is free of liners apart from the via liner, by means of the targeted alteration of the design data and a production process based on the changed design data. By way of example, the via 12 can be displaced in the y direction to the upper edge of a rear side area 40 of the interconnect 14, so that there is a contact location at an edge 42 of the interconnect 14. This and other possibilities for producing contact locations are explained in more detail below with reference to FIGS. 2A to 7.

FIG. 2A shows a plan view of two planes of a design 48 for the patterns or structures of two masks for producing an integrated circuit arrangement and thus ultimately also for structures in two planes of the integrated circuit arrangement itself. A system 50 of coordinates forms the reference for design data for defining the designs and holds true for the designs of FIGS. 2A to 3C. The system 50 of coordinates has an x axis 52, a y axis 54 and a z axis 56. The designs in each case lie in an x-y plane. The system 50 of coordinates with regard to the designs thus has the same position as the system 32 of coordinates with regard to the integrated circuit arrangement 10.

A design plane for the position of mask patterns for producing interconnect trenches in a metallization layer lies opposite to the z direction below a design plane for the position of mask patterns for producing contact holes for vias. The position of edges of the trenches is predefined with the aid of straight lines or lines in the lower design plane. The position of the edges of contact holes is predefined by circles in the upper design plane, see for example the straight lines 58 and 60 for predefining the position of the edge of an interconnect and a circle 62 for predefining the position of a contact hole leading to the interconnect. A width B1 between the straight lines 58 and 60 that run parallel to one another, taking a scaling factor into consideration, defines the width of a trench for the interconnect. A diameter D1 of the circle 62, taking the scaling factor into consideration, defines the diameter of the contact hole. In the design, the width B1 is approximately twice as large as the diameter D1. The circle 62 is centered between the two straight lines 60 and 58. FIG. 2A additionally illustrates a width B2, which, taking the scaling factor into consideration, corresponds to the width of the interconnect liner. The width B2 amounts for example to a tenth of the width B1. Dashed lines 64 and 66 specify the position of the inner edge of the interconnect liner with regard to the design 48.

FIG. 2B shows a design 70, which has been automatically produced from the design explained with reference to FIG. 2A with the aid of a method explained in more detail below with reference to FIG. 8. In the design 70, there is a constriction 72 at lines 58a and 60a corresponding to the straight lines 58 and 60. The constriction 72 is situated beneath the circle 62, the position and diameter D1 of which have remained unchanged. Steps are situated at the ends of the constriction 72. The constriction 72 has a length L1 that is approximately twice as large as the diameter D1 of the circle 62. The constriction 72 has a constant width B3 along the entire length L1. The width B3 of the constriction 72 is equal to the diameter D1. In a different exemplary embodiment, the width B3 is even less than the diameter D1. The circle 62 is centered with respect to the steps at the end of the constriction 72. A contact of the interconnect liner and of the via liner thus occurs in regions which, in the integrated circuit, will later have the same position as overlap regions between the circle 62 and the interspace between the lines 58a and 64a and between the lines 60a and 66a. The dashed lines 64a and 66a correspond to the dashed lines 64 and 66 and specify the position of the interconnect liner with regard to the design 70.

FIG. 2C shows an alternative alteration of the design data in accordance with FIG. 2A, a constriction 82 with ends running in wedge-shaped fashion having been produced in a design 80. The position and the diameter of the circle 62 have remained unchanged. However, the position of the lines 58 and 60 has been changed with the aid of simple geometrical calculations such that lines 58b and 60b forming the constriction 82 have been produced. Outside the constriction 82, the course of the lines 58b and 60b matches the course of the lines 58 and 60. In the region of the constriction 82, the lines 58b and 60b firstly continuously approach one another within a length L3, which is somewhat smaller than the diameter D1 of the circle 62. By way of example, if the interconnect is more than three times as wide as the diameter of the via, then in a different exemplary embodiment the length L3 is greater than D1.

Once the lines 58b and 60b have reached a distance from one another which corresponds to a width B4 having the same value as the diameter D1 of the circle 62, then the lines 58b and 60b run parallel to one another for a length L2. The length L2 has a value that is approximately one and a half times the value of the diameter D1. Afterward, the lines 58b and 60b run apart from one another again within a length L3. The constriction 83 again gives rise to overlap regions between the circle 62 and the interspace between the line 58b and a dashed line 64b and between the line 60B and a dashed line 66b. The dashed lines 64b and 66b represent the position of the interconnect liner relative to the design 80.

The design illustrated in FIG. 2C produces, in the developed circuit arrangement, more favorable current concentration in the region of a constriction of the interconnect that corresponds to the constriction 82. In an alternative exemplary embodiment, the lines 58b and 60b do not change their direction abruptly, but rather continuously, thereby achieving an even more favorable current distribution.

FIG. 3A shows a design 90 with straight lines 92, 94 and 96 arranged in U-shaped fashion in a first design plane and with a circle 98 overlapping the region surrounded by the straight lines 92 to 96. The straight lines 92 to 96 ultimately define the position of the edges of trenches for an interconnect. The circle 98 ultimately defines the position of a contact hole leading to the interconnect. A width B5 between two straight lines 92 and 96 that run parallel to one another defines the width of the trench, taking the scaling factor into consideration. The diameter D2 of the circle 98, taking the scaling factor into consideration, defines the diameter of the contact hole. The width B5 is approximately twice as large as the diameter D2. A dashed line 100 serves to represent the position of the inner edge of the interconnect liner layer. The line 100 is at a distance B6 from the line 92, 94 and 96, which distance amounts for example to approximately a tenth of the width B5.

FIG. 3B shows a design 110 that was automatically produced from the design explained with reference to FIG. 3A with the aid of the method explained below with reference to FIG. 8. In the design 110, lines 114, 116 and 118 correspond to the straight lines 92, 94 and 96 in the design 90. In the design 110, there is a constriction 112 at the right-hand end of the lines 114 and 118. The constriction 112 is formed by the lines 114 and 118 running symmetrically with respect to one another and has stepped ends. At its narrowest location, the constriction 112 has a width B7 corresponding to the diameter D2 of the circle 98. A length L4 of the constriction 112 amounts to approximately one and half times the diameter D2. The position of the circle 98 in the design 110 has remained unchanged with respect to the position of the circle 98 in the design 90. This means that the end side of the interconnect defined by the straight line 94 has been displaced somewhat oppositely to the x direction 52.

Whereas there are no contact regions between the interconnect liner and the via liner in the case of an integrated circuit arrangement produced with the aid of the design 90, there are three contact regions of via liner and interconnect liner in the case of an interconnect/via arrangement produced with the aid of the design 110. In the design 110, overlap regions 122, 124 and 126 between the circle 98 and a dashed line 120, which corresponds to the line 100 and represents the position of the interconnect liner, correspond to the contact regions.

FIG. 3C shows a design 130 that has been produced from the design 90 explained with reference to FIG. 3A upon application of an alternative rule with the aid of the method explained below with reference to FIG. 8. The position of the circle 98 and its diameter D2 have remained unchanged. However, a constriction 132 has been produced at lines 134, 136 and 138 corresponding to the straight lines 92 to 96. The constriction 132 has a wedge-shaped section having a length L5. In the region of the circle 98, the lines 134 and 138 are led parallel to one another over a length L6 until the straight line 136 is reached. The value of the length L6 is approximately a fifth greater than the value of the diameter D2. The length L5 is approximately half as large as the diameter D2 of the circle 98. A width B8 of the constriction 132 at its narrowest location is equal to the diameter D2.

An interconnect/via arrangement produced with the aid of the design 130 also gives rise to three contact regions in overlap regions 140, 142 and 144 between the circle 98 and a dashed line 146 indicating the position of the interconnect liner.

FIG. 4A shows a design 150 with a straight line 152, which ultimately predefines the position of the edge of a trench for an interconnect. A dashed straight line 154 illustrates the position of an interconnect liner. A circle 156 is associated with another design plane and predefines the position of a contact hole leading to the interconnect. The circle 156 is at a distance from the straight line 152 in the case of which no overlap occurs between the circle 156 and the straight line 152 or the straight line 154.

A system 160 of coordinates having an x axis 162, a y axis 164 and a z axis 166 holds true for FIGS. 4A to 7. The statements made with respect to the system 50 of coordinates hold true with regard to the position of design planes and system 160 of coordinates.

FIG. 4B shows a design 170 that was automatically produced from the design 150 with the aid of the method explained below with reference to FIG. 8. The position of the lines 152 and 154 has not changed. By contrast, a circle 156a has been displaced in the y direction in comparison with the circle 156 such that its edge has a largest y coordinate corresponding to the y coordinate of the line 152. On account of the displaced circle 156a, there is an overlap region 172 at which the circle 156a overlaps the interspace between the straight line 152 and the dashed straight line 154. This overlap leads to an overlap between the interconnect liner and the via liner in the case of an interconnect/contact hole arrangement produced in accordance with the design 170.

FIG. 5A shows a design 180 for the arrangement of a contact hole represented by a circle 182 at the end of a pattern formed by straight lines 184, 186 and 188 arranged in U-shaped fashion. The circle 182 is situated in the center of a region enclosed by the straight lines 184 to 188 and has a diameter D4 that is approximately one third smaller than a width B9 of the pattern that corresponds to the distance between the straight lines 184 and 188 running parallel to one another. In the design 180, there are no overlap regions between the circle 182 and a dashed line 190 representing the position of the interconnect liner.

FIG. 5B shows a design 200 that was automatically produced from the design 180. The position of the lines 184 to 188 has remained unchanged. However, the circle 182 has been displaced in the x direction to produce a circle 182a. The largest x coordinate of the circle 182a corresponds to the x coordinate of the straight line 186, which specifies the position of the end side of the pattern. An overlap region 202 results between the circle 182a and the region lying between the dashed line 190 and the straight line 186.

FIG. 5C shows a design 210 that was automatically produced from the design 180 in the case of an alternative method. The position of the straight lines 184, 186 and 188 has remained unchanged. However, the circle 182 has been displaced both in the x direction and in the y direction to produce a circle 182b. The largest x coordinate of the circle 182b corresponds to the x coordinate of the straight line 186. The largest y coordinate of the circle 182b corresponds to the y coordinate of the straight line 184. As a result, there are two overlap regions 212 and 214 between the circle 182b and the region lying between the line 190 and the straight line 184 and respectively the straight line 186. The design 214 was produced for example by successive application of rules for shifting the circle 182 in the x direction and in the y direction.

FIG. 6A shows a design 220 containing straight lines 222, 224 and 226 that are arranged in U-shaped fashion and ultimately predefine the position of the edge of a trench for an interconnect. A distance between the straight lines 222 and 226 that lie parallel to one another defines a width B10 of the pattern formed by the straight lines 222, 224 and 226. Moreover, the design 220 contains a circle 228 which ultimately predefines the position of a contact hole. A dashed line 230 shows the position of an interconnect liner with regard to the design 220. In the design 220, there are already two overlap regions 232 and 234, in which the circle 228 overlaps the region between the line 222 and the dashed line 230 and between the line 226 and the dashed line 230. The circle 232 has a diameter D5 that is equal to the width B10. By contrast, there is no overlap region at the end of the pattern formed by the straight lines 222 to 226, i.e. in the region of the straight line 224.

FIG. 6B shows a design 240 that was automatically produced from the design 220. The position of the straight lines 222 to 226 has remained unchanged. However, the circle 228 has been displaced in the x direction to produce a circle 228a. The largest x coordinate of the circle 228a corresponds to the x coordinate of the straight line 224. Accordingly, in addition to the overlap regions 232 and 234, in the design 240, there is a third overlap region 242 at the end side of the trench represented by the straight lines 222 to 226. The number of overlap regions has thus been increased by the application of the automatic method.

FIG. 7 shows a design 250, in which there are four overlap regions 252, 254, 256 and 258 between a circle 260 and regions between the straight lines 262, 264, 266 and 268 forming a square and a dashed line 270. The circle 260 has a diameter D6. The square has a side length B11 and B12, respectively, which is equal to the diameter D6. The design 250 was likewise produced automatically with the aid of the method explained below with reference to FIG. 8. The distance between the straight lines 252 and 256 and between the straight lines 254 and 258 was reduced in this case.

FIG. 8 shows method steps of a method for increasing the number of contact locations of via liner and interconnect liner in an integrated circuit arrangement in a targeted manner. The method begins in a method step 300. In a subsequent method step 302, design data are predefined, said design data being stored for example in accordance with a standardized data format, e.g. in accordance with the format GDSII (graphic design system), which is utilized e.g. by the program Cadence Framework. The design data are stored in a file and predefine a bit pattern or a vector graphic for different design planes.

In a method step 304, rules according to which the design data are intended to be changed are predefined. The rules are stored in a program, for example, which changes the geometrical patterns of the design in the manner of an image editing program.

In a method step 306, a first contact location between a via and an interconnect is determined, which is predefined by the design data. In a subsequent method step 308, a check is made to ascertain whether an alteration in accordance with the predefined rules is possible for a contact location that has been determined, i.e. in the exemplary embodiment:

whether a constriction of an interconnect is possible, or
whether a displacement of a contact hole for a via or a displacement of an interconnect is possible.

In the exemplary embodiment, firstly a check is made to ascertain whether a constriction is possible. If this is the case, then the design data are correspondingly changed in a method step 310 that directly succeeds method step 308. In a subsequent method step 312, a check is made to ascertain whether, at the contact location determined, a further rule leads to an increase in the number of overlap regions or ultimately contact regions. If this is the case, then the method is continued with method step 308. The method is then in a loop comprising the method steps 308 to 312. This loop is left in method step 312 only when it is ascertained that there is no longer any further rule that might lead, in accordance with the predefined rules, to an improvement in the design for the contact location determined. In this case, a method step 314 directly succeeds method step 312.

Method step 314 also directly succeeds method step 308 if it is ascertained in said method step 308 that no alteration is possible in accordance with a rule.

In method step 314, a check is made to ascertain whether there are further unprocessed contact locations in accordance with the original design data. If this is the case, then method step 306 directly succeeds method step 314 again. The method is thus in a method loop comprising the method steps 306 to 314. In the course of performing method steps 308 to 314 in this method loop, gradually all the contact locations of the design are checked and, if appropriate, the design data for the contact locations are changed in accordance with the predefined rules. The loop comprising method steps 308 to 314 is left in method step 314 only when there are no further contact locations in accordance with the design that have not yet been checked and, if appropriate, changed. In this case, a method step 316 directly succeeds method step 314.

In method step 316, the changed design data are stored in a file and are thus available for further processing, for example for the production of masks for producing the integrated circuit arrangement. As an alternative or in addition, the changed design data are output, for example as a graphical representation on a screen. A developer then has the opportunity to test samples of the changes that have been carried out. The method is ended in a method step 318.

FIG. 9 shows an apparatus 320 for performing method steps 300 to 318 explained with reference to FIG. 8. The apparatus 320 contains a predefinition unit 322 for design data, a predefinition unit 324 for the rules, a control unit 326, a change unit 328 and a memory unit 330, e.g. a RAM (random access memory). The predefinition units 322 and 324, the control unit 326 and the change unit 328 access the memory unit 330 via a memory bus 332. The control unit 326 controls the operations in the predefinition unit 322, in the predefinition unit 324 and in the change unit 328, see arrows 334 to 338.

The predefinition unit 322 serves for predefining the design data, i.e. for performing method step 302. The predefinition unit 324 serves for storing rules, i.e. for performing method step 304. The change unit 328 serves for changing the design data in accordance with the rules predefined by the predefinition unit 324.

An input unit 340, e.g. a keyboard, an output unit 342, e.g. a screen, and a floppy disk drive 344 are additionally connected to the apparatus 320 via a line 346, 348 and 350, respectively.

In one exemplary embodiment, the functions of the units 322 to 328 are implemented by electronic switching mechanisms that do not contain a processor. In an alternative exemplary embodiment, the functions of the units 322 to 328 are implemented with the aid of a processor 352 that processes a program in a program memory unit in a program memory unit 354, see arrow 356.

The invention claimed is:

1. An integrated circuit arrangement comprising:
at least one metallization layer containing a multiplicity of electrically conductive interconnects;
an interconnect dielectric between the interconnects;
electrically conductive interconnect intermediate material arranged in each case between a side area of an interconnect and the interconnect dielectric;
a multiplicity of electrically conductive connecting sections which in each case form a section of an electrically conductive connection to or from an interconnect;
a connecting section dielectric between the connecting sections; and
connecting section intermediate material arranged in each case at least one of between a connecting section and the connecting section dielectric and between a connecting section and an interconnect, wherein the interconnect intermediate material and the connecting section intermediate material makes contact with one another at at least one connection.

2. The circuit arrangement as claimed in claim 1, wherein at least one of:
- at the connection, the interconnect intermediate material and the connecting section intermediate material make contact at two or three or four side areas of an interconnect; and
- the interconnect intermediate material and the connecting section intermediate material make contact at an edge formed by a contact line of two side areas of the interconnect.

3. The circuit arrangement as claimed in claim 1, wherein at least two sections of the same interconnect or of different interconnects are wider than the connecting sections at the connecting sections, and wherein the contact regions are situated at side areas of the sections whose normal directions are situated transversely or oppositely with respect to one another.

4. The circuit arrangement as claimed in claim 1, wherein at least one of:
- the interconnect comprises copper, a copper alloy containing at least ninety-five percent copper, aluminum, or an aluminum alloy containing at least ninety-five percent aluminum,
- at least one of the interconnect dielectric and the connecting section dielectric contains an oxide or a dielectric having a dielectric constant of less than 3.9,
- at least one of the interconnect intermediate material and the connecting section intermediate material contains a nitride,
- the interconnect intermediate material contains a refractory metal, and
- the connecting sections contain tungsten or copper.

5. The circuit arrangement as claimed in claim 4, the oxide comprises contains silicon dioxide.

6. The circuit arrangement as claimed in claim 4, wherein the nitride comprises a metal nitride.

7. The circuit arrangement as claimed in claim 4, wherein the refractory metal comprises tantalum.

8. The circuit arrangement as claimed in claim 1, wherein at least one of:
- an area of an interconnect that is adjacent to a connecting section is than eighty percent free of an electrically conductive intermediate material, and
- the circuit arrangement has been fabricated by means of a damascene technique or by means of a dual damascene technique.

9. An integrated circuit arrangement comprising:
- at least one metallization layer containing a multiplicity of electrically conductive interconnects;
- an interconnect dielectric between the interconnects;
- electrically conductive interconnect intermediate material arranged in each case between a side area of an interconnect and the interconnect dielectric;
- a multiplicity of electrically conductive connecting sections which in each case form a section of an electrically conductive connection to or from an interconnect;
- a connecting section dielectric between the connecting sections; and
- connecting section intermediate material arranged in each case at least one of between a connecting section and the connecting section dielectric and between a connecting section and an interconnect,
- wherein the interconnect intermediate material and the connecting section intermediate material makes contact with one another at at least one connection,
- wherein at least one of:
- the interconnect has a constriction at the connecting section, the width of said constriction being chosen such that contact regions are produced at opposite side areas of the interconnect, and
- the constriction, along the longitudinal axis of the interconnect, has a length that is less than five times or less than three times the width of the constriction.

10. The circuit arrangement as claimed in claim 9, wherein at least one of: the connecting section is arranged at an end of the interconnect, and the constriction has the form of a wedge or the form of a step.

11. The circuit arrangement as claimed in claim 9, wherein at least one of: the interconnect extends in at least two different directions from the connecting section, and each end of the constriction has the form of a wedge or the form of a step.

* * * * *

UNITED STATES PATENT AND TRADEMARK OFFICE
CERTIFICATE OF CORRECTION

| | | |
|---|---|---|
| PATENT NO. | : 7,315,998 B2 | Page 1 of 1 |
| APPLICATION NO. | : 10/526881 | |
| DATED | : January 1, 2008 | |
| INVENTOR(S) | : Armin Fischer et al. | |

It is certified that error appears in the above-identified patent and that said Letters Patent is hereby corrected as shown below:

Column 11, in claim 5, line 1, after "claim 4," insert --wherein--.

Columns 11-12, in claim 8, line 4, after "section is" insert --more--.

Signed and Sealed this

Twentieth Day of May, 2008

JON W. DUDAS
*Director of the United States Patent and Trademark Office*